US007403291B2

(12) United States Patent
Yamamoto et al.

(10) Patent No.: US 7,403,291 B2
(45) Date of Patent: Jul. 22, 2008

(54) METHOD OF CALCULATING TWO-DIMENSIONAL WAVEFRONT ABERRATION

(75) Inventors: Kazuki Yamamoto, Utsunomiya (JP); Akihiro Nakauchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 241 days.

(21) Appl. No.: 11/228,116

(22) Filed: Sep. 16, 2005

(65) Prior Publication Data

US 2006/0061757 A1 Mar. 23, 2006

(30) Foreign Application Priority Data

Sep. 16, 2004 (JP) .............................. 2004-269731

(51) Int. Cl.
*G01B 9/02* (2006.01)
(52) U.S. Cl. ...................................... 356/515; 356/124
(58) Field of Classification Search ................. 356/515, 356/521, 124
See application file for complete search history.

(56) References Cited

U.S. PATENT DOCUMENTS

| 6,312,373 | B1 | 11/2001 | Ichihara |
| 7,088,426 | B2 | 8/2006 | Hirukawa et al. |
| 7,102,731 | B2 | 9/2006 | Hirukawa et al. |
| 2003/0128346 | A1 | 7/2003 | Murakami et al. |
| 2004/0174533 | A1* | 9/2004 | Nakauchi ..................... 356/515 |
| 2005/0264827 | A1* | 12/2005 | Schriever et al. ............. 356/509 |

FOREIGN PATENT DOCUMENTS

| JP | 2000-097666 | 4/2000 |
| JP | 2000-146705 | 5/2000 |
| JP | 2000-277411 | 10/2000 |
| JP | 2000-277412 | 10/2000 |
| JP | 2005-183415 | 7/2005 |
| WO | WO 03/075328 | 9/2003 |
| WO | WO 03/087945 A2 * | 10/2003 |

OTHER PUBLICATIONS

Goldberg, Extreme Ultraviolet Interferometry, Ph.D. Thesis, University of California, Berkeley, Dec. 1997, pp. 61-103.*

(Continued)

*Primary Examiner*—Samuel A Turner
(74) *Attorney, Agent, or Firm*—Morgan & Finnegan, LLP (57) ABSTRACT

An adjusting method measures a wavefront aberration in a first direction of a target optical system and a wavefront aberration in a second direction different from the first direction of the target optical system, and calculates a first correction value and a second correction value based on a determinant assuming that a matrix that is made by adding a first correction value to each column of the first matrix is equal to a matrix that is made by adding a second correction value to each row of the second matrix. The first correction value is different every column, and the second correction value is different every row. The first matrix represents the wavefront aberration in the first direction, and the second matrix represents the wavefront aberration in the second direction. The adjusting method obtains a two-dimensional wavefront aberration of the target optical system by calculating the matrix that is made by adding the first correction value that has been calculated to the first matrix and/or the matrix that is made by adding the second correction value that has been calculated to the second matrix, and adjusts the target optical system based on the obtained two-dimensional wavefront aberration.

12 Claims, 8 Drawing Sheets

OTHER PUBLICATIONS

Hasegawa et al, Recent Progress of EUV Wavefront Metrology in EUVA, Proc. of SPIE, vol. 5533, Aug. 2004, pp. 27-36.*

Japanese Office Action for Patent Application No. 2004-269731 mailed Sep. 12, 2006 with original copy as filed and its English translation.

* cited by examiner

FIG. 13　PRIOR ART

METHOD OF CALCULATING TWO-DIMENSIONAL WAVEFRONT ABERRATION

BACKGROUND OF THE INVENTION

The present invention relates generally to a measurement of optical performance of an optical element, and more particularly to a calculation of two-dimensional optical performance of a target optical system, such as a projection optical system that transfers a mask pattern onto an object to be exposed.

A projection exposure apparatus has conventionally been used to transfer a mask (or reticle) pattern onto an object to be exposed in manufacturing devices, such as semiconductor devices, image pickup devices, display devices and magnetic heads, in the photolithography process. This exposure apparatus is required to transfer the pattern on the reticle onto the object precisely at a predetermined magnification. For this purpose, it is important to use a projection optical system having excellent imaging performance and sufficiently reduced aberration. In particular, due to the recent demands for finer processing to the semiconductor devices, a transferred pattern is more sensitive to the aberration of the optical system. Therefore, there is a demand to measure the optical performance, such as a wavefront aberration, of the projection optical system with high precision.

One conventional method that actually exposes a mask pattern onto a wafer, and observes and inspects the resist image using a scanning electron microscope ("SEM") or another means has a problem in a long inspection time due to the exposure and development, difficult SEM operations, and bad inspection reproducibility due to errors caused by resist applications and developments. Accordingly, as a solution for these problems, various measuring devicees have conventionally been proposed, such as a shearing interferometer, such as a lateral shearing interferometer ("LSI"), or a Talbot interferometer that utilizes the shearing interferometry. More recently, a line diffraction interferometry ("LDI") that has a slit used to form an ideal cylindrical or elliptical wave. See, for example, Japanese Patent Applications, Publication Nos. 2000-146705, and 2000-97666.

The LSI and LDI utilize a one-directional slit or diffraction grating. Therefore, the wavefront aberration of the target optical system obtained by analyzing the measured interference fringe is the wavefront aberration that provides a correct relative relationship in only one direction. Therefore, in order to obtain the wavefront aberration that provides a correct two-dimensional relative relationship, it is necessary, for example, to obtain one-dimensional wavefront aberration information in each of two different, e.g., orthogonal directions and to synthesize them with each other. Yet, no concrete synthesizing method has been proposed. Without correctly calculated two-dimensional wavefront aberration, a correct adjustment for eliminating the aberration is unavailable, or a high-quality exposure cannot be obtained.

BRIEF SUMMARY OF THE INVENTION

Accordingly, the present invention is directed to a calculating method, a measuring device, an exposure apparatus and method using the same, for calculating two-dimensional optical performance of a target optical system from two optical performance data of the target optical system in two different directions, each optical performance data of the target optical system relating to only one of the two different directions.

A method according to one aspect of the present invention for obtaining information relating to two-dimensional optical performance of a target optical system includes the steps of calculating a first correction value and/or a second correction value used to synthesize first and second measurement data with each other, the first measurement data representing optical performance of the target optical system in a first direction and providing a correct relative relationship in the first direction, the second measurement data representing optical performance of the target optical system in a second direction different from the first direction and providing a correct relative relationship in the second direction, and synthesizing the first and second measurement data with each other using the first and/or second correction values calculated by the calculating step.

A measuring device according to another aspect of the present invention for measuring two-dimensional optical performance of a target optical system includes a measuring part for obtaining first and second measurement data, the first measurement data representing optical performance in a first direction of the target optical system and providing a correct relative relationship in the first direction, the second measurement data representing optical performance in a second direction of the target optical system different from the first direction and providing a correct relative relationship in the second direction, and a controller for calculating a first correction value and/or a second correction value used to synthesize first and second measurement data with each other, and for synthesizing the first and second measurement data with each other using the first and/or second correction values.

An exposure apparatus according to another aspect of the present invention for exposing a pattern of a mask onto an object includes a projection optical system for projection the pattern onto the object, and the above measuring device for detecting optical performance of the projection optical system as a target optical system.

An exposure method according to still another aspect of the present invention includes the steps of calculating optical performance of a projection optical system using the above exposure apparatus, adjusting the projection optical system based on the optical performance of the projection optical system, which is calculated by the calculating step, and exposing an object using the exposure apparatus that includes the projection optical system adjusted by the adjusting step.

A device manufacturing method according to still another aspect of the present invention includes the steps of exposing an object using the above exposure apparatus, and developing the object exposed.

Other objects and further features of the present invention will become readily apparent from the following description of the preferred embodiments with reference to accompanying drawings.

DETAILED DESCRIPTION OF THE PREFERRED EMBODIMENTS

Referring now to the accompanying drawings, a description will be given of various embodiments according to the present invention.

First Embodiment

Figure 1:
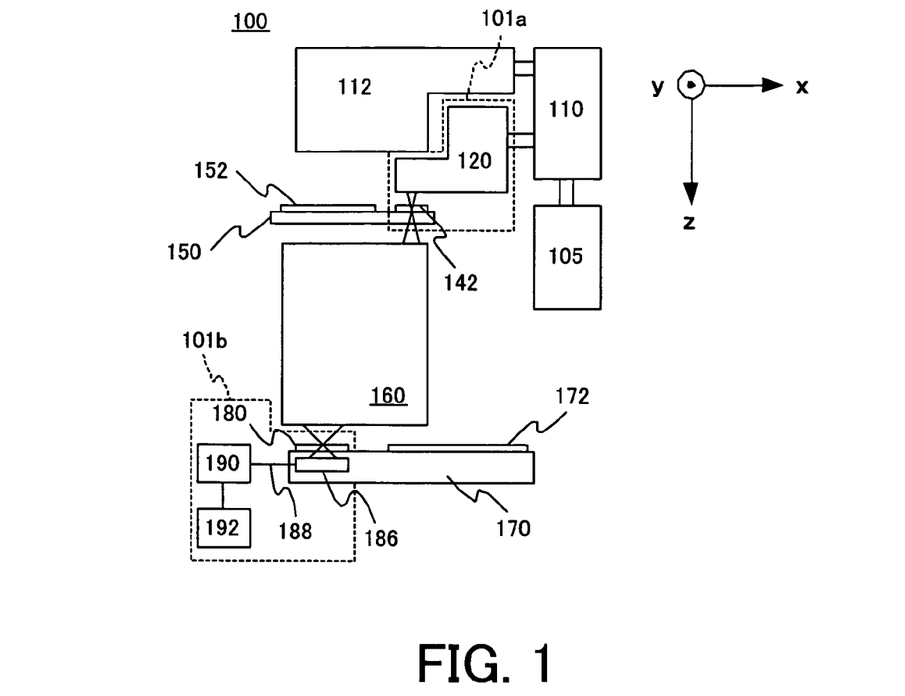
FIG. 1 is a schematic block diagram of an exposure apparatus mounted with a measuring device.

Referring now to the accompanying drawings, a description will be given of an exposure apparatus mounted with a measuring device according to a first embodiment of the present invention. Here, FIG. 1 is a schematic structure of an exposure apparatus 100. In this embodiment, the first and second directions correspond to x and y directions in the coordinate system shown in FIG. 1.

The exposure apparatus 100 of this embodiment is a projection exposure apparatus to expose a circuit pattern of a mask 152 onto an object (plate) 172, e.g., in a step-and-repeat or a step-and-scan manner. A description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 100 includes a measuring device (101a, 101b), an illumination apparatus, an alignment optical system 120, a mask 152, a projection optical system 160, and a plate 172.

The illumination apparatus illuminates the mask 152 that has a circuit pattern to be transferred, and therefore, includes a light source section 105 and an illumination optical system (110, 112). The light source section 105 may use as a light source an ArF excimer laser with a wavelength of approximately 193 nm, and a KrF excimer laser with a wavelength of approximately 248 nm. A kind of laser is not limited to excimer laser, and the number of laser units is not limited. When the light source unit 105 uses a laser, it is desirable to employ a beam shaping optical system that turns a parallel beam from a laser light source into a desired beam shape and an incoherently turning optical system that turns a coherent laser beam into an incoherent one. A light source applicable to the light source unit 105 is not limited to a laser. One or more lamps may be used, such as a mercury lamp and a xenon lamp.

The illumination optical system is an optical system that illuminates the mask 152. It includes a lens, a mirror, a light integrator, a a stop, and the like. The illumination optical system of this embodiment includes a deflection optical system 110, and a first illumination optical system 112. The deflection optical system 110 deflects the light from the light source section 105, and introduces the light into the firs and second illumination optical system 112 and 120. The first illumination optical system 112 is an optical system that illuminates the mask 152, and includes, for example, a condenser lens, a fly-eye lens, an aperture stop, a condenser lens, a slit, and an imaging optical system in this order.

The alignment optical system 120 serves to illuminate the mask used for the measuring device (101a, 101b), i.e., first and second masks 142 and 180, which will be described later, and is thus sometimes referred to as a second illumination optical system in this specification. The alignment optical system 120 constitutes an alignment scope, and part of the measuring device 101, as described later. The second illumination optical system 120 is arranged outside the optical path during the normal exposure, and FIG. 1 omits a driving mechanism that drives the alignment optical system 120. The alignment scope images an alignment mark (not shown) on the mask 152 and an alignment mark on the wafer stage 170 via the projection optical system 160, and provides an alignment of the wafer stage 170.

The mask (or reticle) 152 is made for example, of quartz, and has a circuit pattern or an image to be transferred. It is supported and driven by a mask stage (or a reticle stage) 152. The diffracted light from the mask 152 passes the projection optical system 160, and then is projected onto the plate 172. The mask 152 and the plate 172 are located in an optically conjugate relationship. Since the exposure apparatus 100 of the instant embodiment is a scanner, the mask 152 and the plate 172 are scanned at a speed ratio of the reduction ratio. Thus, the pattern of the mask 152 is transferred to the plate 172. If it is a step-and-repeat exposure apparatus (referred to as a "stepper"), the mask 152 and the plate 172 remain still in exposing the mask pattern.

The projection optical system 160 may use a dioptric system solely including a plurality of lens elements, a catadioptric optical system including a plurality of lens elements and at least one mirror, and a catoptric optical system of a full mirror type, and so on. The measuring device (101a, 101b) measures the optical performance (such as a wavefront aberration) of the projection optical system 160.

The plate 172 is an exemplary object to be exposed, such as, a wafer and a LCD. A photoresist is applied to the plate 172. The stage 170 supports the plate 172 and part of the measuring device (101a, 101b). The stage 170 may use any structures known in the art. A detailed description of its structure and operation is omitted. The stage 170 may use, for example, a linear motor to move the plate 172 in the XY directions. The mask 152 and plate 172 are, for example, scanned synchronously. The positions of the stage 170 and mask stage 150 are monitored, for example, by the second illumination optical system 120, so that both are driven at a constant speed ratio.

The measuring device (101a, 101b) includes the alignment optical system (or second illumination optical system) 120, a first mask 142, a second mask 180, an image taking means 186, a communication cable 188, a controller 190, and a memory 192. In this embodiment, the measuring device (101a, 101b) includes an interferometer that measures the optical performance of the projection optical system 160 as a target optical system by detecting an interference fringe, and the interferometer uses an LDI. However, the measuring device (101a, 101b) may use an LSI, as described later.

Figure 2:
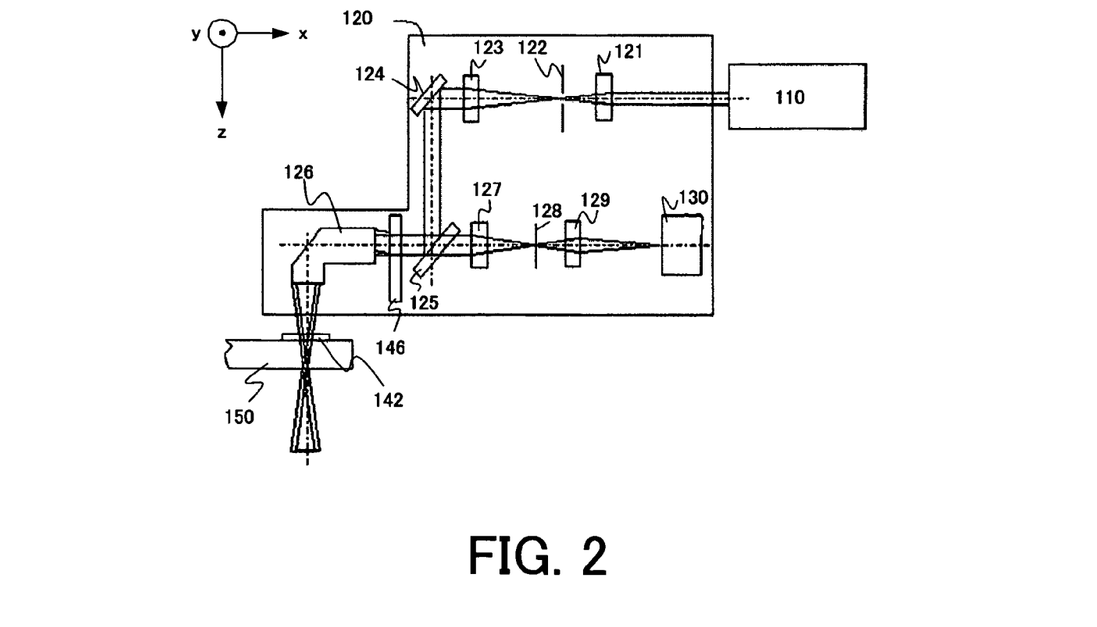
FIG. 2 is an optical-path diagram of a second illumination optical system, a light splitting means and a first mask in the measuring device according to the first embodiment of the present invention, applicable to the exposure apparatus shown in FIG. 1.

As shown in FIG. 2, the second illumination optical system 120 includes illuminating optical systems 121 and 123, a field stop 122 for the illumination optical system, a deflection mirror 124, a half mirror 125, a condenser lens 126, optical system 127 and 129 for an image pickup system, a reference mark 128, and an image taking means 130. Here, FIG. 2 is an optical-path diagram of the second illumination optical system 120, the first mask 142 and the light splitting means 146 in the measuring device (101a, 101b).

The optical system 121 is a condenser optical system that condenses the light into the field stop 122, and the optical system is a collimeter that turns the light from the field stop 122 into the parallel light. The deflection mirror 124 and the half mirror 125 deflect the light from the optical system 124, and the condenser lens 126 condenses the light into the first mask 142. Since the light supplied form the light source section 105 via the deflection optical system 110 passes the optical elements 121 to 126 to the projection optical system 160, and the optical elements 125 to 130 serve as an alignment scope for the mask stage 150 and the wafer stage 170, the condenser lens 126 serves as an objective lens for alignments between the mask pattern and the plate 172.

Figure 3:
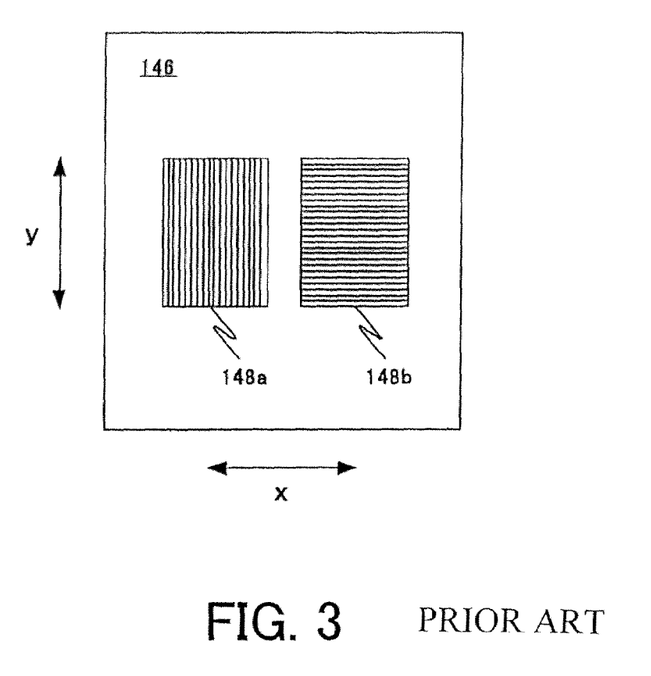
FIG. 3 is a schematic plane view of the light splitting means shown in FIG. 2.

The light splitting means 146 is implemented by a grating having a structure shown in FIG. 3, for example. The light splitting means 146 is provided between the condenser lens 126 and the half mirror 127 in the second illumination optical system 120 shown in FIG. 2. As a result, the condenser lens 126 receives plural lights amplitude-split by the light splitting means 146. The diffraction grating 148a corresponds to the slit 143a and window 144a in the first mask 142, which will be described later, and the diffraction grating 148b corresponds to the slit 143b and window 144b.

This embodiment integrates the first mask 142 with a substrate (not shown) (corresponding to the substrate 140) in the mask stage 150. This substrate is made, for example, of a transparent substrate, such as quartz and calcium fluoride. The first mask 142A is formed at one of the sides of this substrate. The condenser lens 126 condenses the light into the first mask 142A arranged on the mask stage 150. The condensed light provides a σ=1 illumination, similar to the NAo of the projection optical system 160 at the reticle side or the object side. Plural lights that are amplitude-split by the light splitting means 146 enter the condenser lens 126, and thus plural images are condensed into the first mask 142A. A size of the condensed image is restricted to a size determined by the field stop 122.

Figure 4:
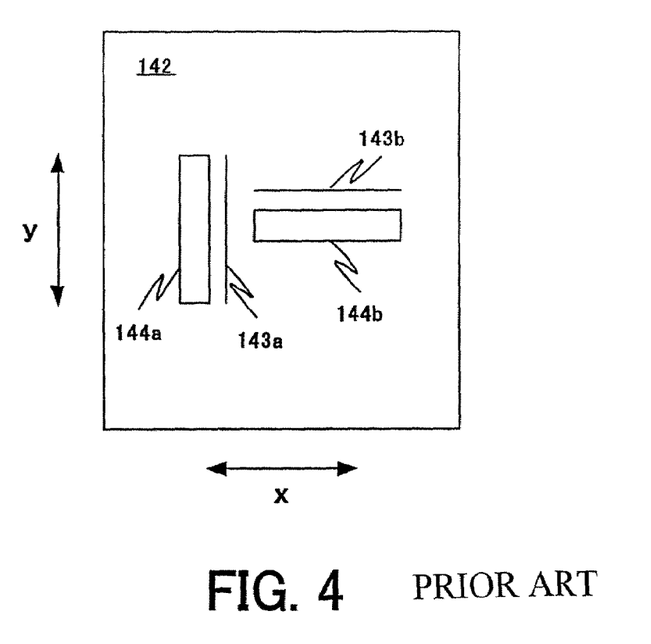
FIG. 4 is a schematic plane view of the first mask shown in FIG. 2.

FIG. 4 shows a structure of the first mask 142A. Here, FIG. 4 is a schematic plane view of the first mask 142. The first mask 142 includes a pair of a 0° orienting slit 143a and a window 144a, and a pair of a 90° orienting slit 143b and a window 144b. Both pairs have the same width and length but different orientations. A width Δw of the slits 143a and 143b is given by Equation 1 below, where NAi is an NA of the projection optical system 160 at the reticle side or an object surface side, and λ is a wavelength of the exposure light.

$$\Delta r < 0.5 \cdot \lambda / NAi \quad \text{[EQUATION 1]}$$

The equiphase of the light diffracted from the slit can be maintained in a range of NAi when the width of the slits 143a and 144b is set to one defined by Equation 1. On the other hand, the width Δr' of the windows 144a and 144b is smaller than λ/NAi. While they may be as large as one defined in Equation 1, the width Δr' is made wider so as to maintain a sufficient light intensity, because the light that pass the windows 144a and 144b pass the slit that satisfies Equation 1 at the wafer side as discussed later, and no equiphase is necessary at the reticle side.

A pitch of the diffraction grating 148a is determined and the mask stage 150 positions the first mask 142 so that among the lights that are diffracted by the diffraction grating 148a, the 0th order light images on the slit 143a and the 1st order diffracted light images on the window 144a. The light-shielding part on the mask 142 shields other diffracted lights. The −1st order diffracted light may be used instead of the 1st order diffracted light, and ±1st order diffracted lights may be used instead of the 0th order light.

In FIG. 3, the light splitting means 146 is an amplitude type diffraction grating. In using the slit 144 that is long in the y direction, the diffraction grating that arranges lines in the x direction like 148a shown in FIG. 4. The diffraction grating 148a splits the light in the x direction. The projection optical system 160 images the split lights onto the second mask 180. The diffraction gratings 148a and 148b are driven by the driving mechanism of the mask stage 150 on which the light splitting means 146 is placed.

Figure 5:
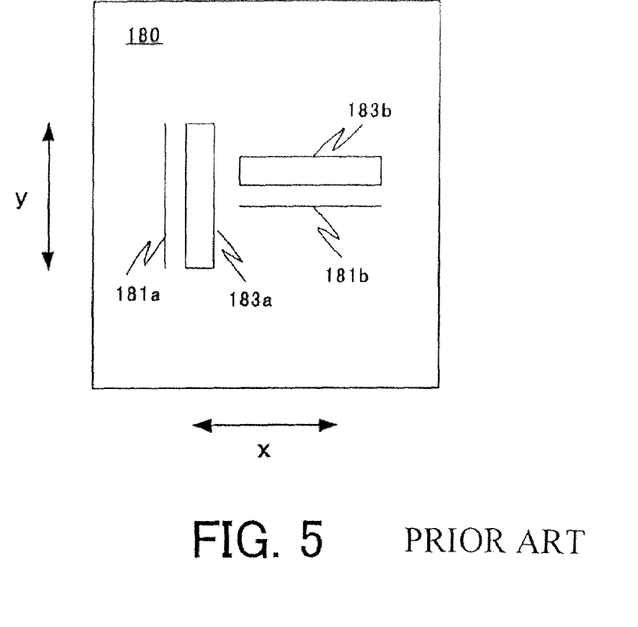
FIG. 5 is a schematic plane view of a second mask shown in FIG. 2.

The second mask 180 includes, as shown in FIG. 5, a pair of a 0° orienting (y direction) slit 181a and a window 183a, and a pair of a 90° orienting (x direction) slit 181b and a window 183b. Here, FIG. 5 is a schematic plane view of the second mask 180. The pair of the slit 181a and window 183a and the pair of the slit 181b and window 183b have the same width and length but different orientations. A width Δw of the slits 181a and 181b is smaller than a diffraction limit defined as follows, where NAi is an NA of the projection optical system 160 at the wafer side or an image surface side, and λ is a wavelength of the exposure light.

$$\Delta w < 0.5 \cdot \lambda / NAi \quad \text{[EQUATION 2]}$$

The equiphase of the light diffracted from the slit can be maintained in a range of NAi when the width of the slits 181a and 181b is set to one defined by Equation 2. A width Δw' of the windows 183a and 183b is determined by the spatial frequency of the projection optical system to be measured. It is made narrow for low frequency measurements, and made wide for high frequency measurements. Δw' is given by the next equation where f is a spatial frequency of a pupil of the projection optical system 160, and the wavefront aberration that has one period at the pupil radius has a frequency f of 1:

$$\Delta w' = 2 \cdot f \cdot \lambda / NAi \quad \text{[EQUATION 3]}$$

A greater length Lw improves the light intensity, but should be smaller than the isoplanatic area where the identity of the aberration of the projection optical system 160 can be maintained.

The image taking means 186 is a CCD etc., and detects an interference fringe of two lights from the slit 181a or 181b and the window 183a or 183b. The cable 188 connects the image taking means 186 and the controller 190 so that they can communicate with each other. The controller 190 obtains phase information from an output from the image taking means 186. The memory 192 stores a measuring method shown in FIG. 8, which will be described later, a processing method for obtaining the phase information from the output of the image taking means 186, phase information obtained by the controller 190, a control method conducted by the controller 190, and other data.

Figure 8:
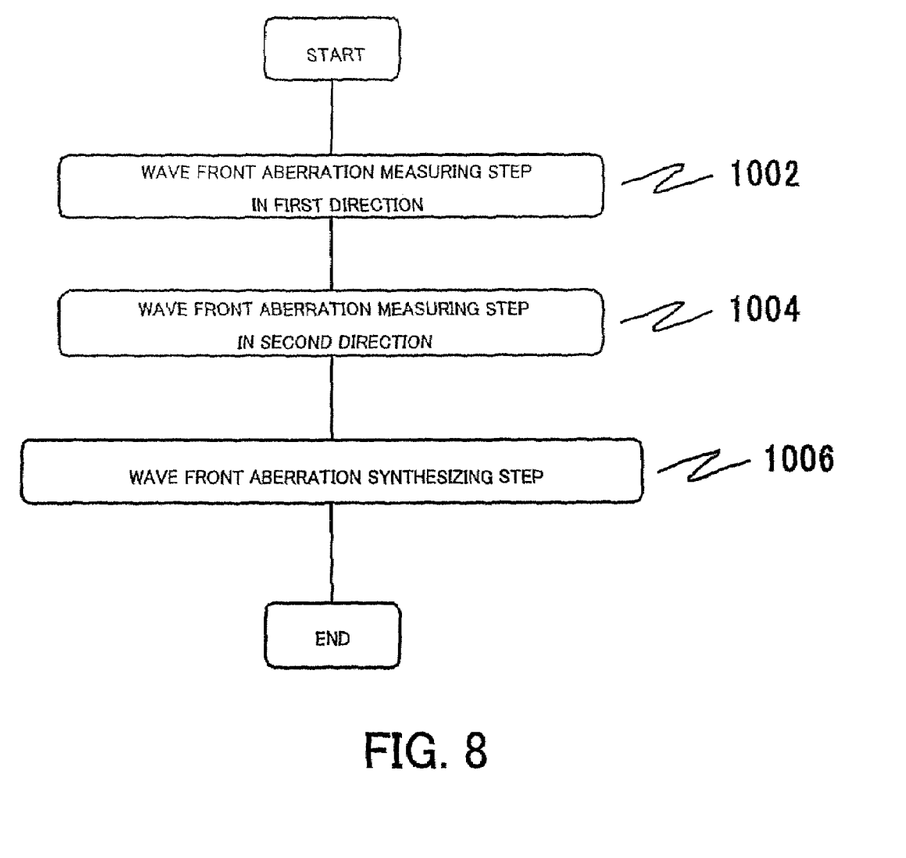
FIG. 8 is a flowchart for explaining an operation of the measuring device shown in FIG. 1.

Referring now to FIG. 8, a description will be given of an operation of the measuring device (101a, 101b). Here, FIG. 8 is a flowchart for explaining the operation of the measuring device (101a, 101b). First, the wavefront aberration of the projection optical system 160 in the x direction is measured (step 1002).

In FIG. 1, the light emitted from the light source section 105 is deflected to the second illumination optical system 120 for imaging performance measurements by the deflection optical system 110. The light from the deflection optical system 110 is condensed into the optical system 121 for the illumination optical system, and irradiated onto the field stop 122. The field stop 122 has a size enough to irradiate the first mask 142 on the substrate 140. The light from the field stop 122 is collimated by the optical system 123, deflected by the deflection mirror 124 and half mirror 125, and introduced into the condenser lens 126. The condenser lens 126 condenses the light into the first mask 142.

In step 1002, the driving mechanism (not shown) moves the illumination optical system 120 and the mask stage 150 relative to each other so that the light from the condenser lens 126 irradiates only the 0° orienting slit 143a and window 144a.

Since the slit 143a has a width that meets Equation 1, the light exited from the slit 143a becomes the diffraction light having an equiphase wavefront in the x direction. On the other hand, the light diffraction in the y direction or the longitudinal direction of the slit 143a is so small that the condenser lens 126 condenses into the slit 143a the light that has a NA equal to or greater than the NA of the projection optical system 160 at the object side or the reticle side, at least in the y direction in FIG. 4. Thereby, the light can be irradiated onto the entire pupil surface in the projection optical system 160. The light has an equiphase wavefront in the x direction in FIG. 4. On the other hand, the light that passed the window 144a is the light with an aberration of the second illumination optical system 120. The slit 143a and window 144a in the first mask 142 are imaged on the second mask 180 placed on the wafer stage 170 via the projection optical system 160. The position of the second mask 180 is adjusted by driving the wafer stage 170 so that the slit 143a in the first mask 142 images on the window 183a in the second mask 180 and the window 144a images on the slit 181a.

Figure 6:
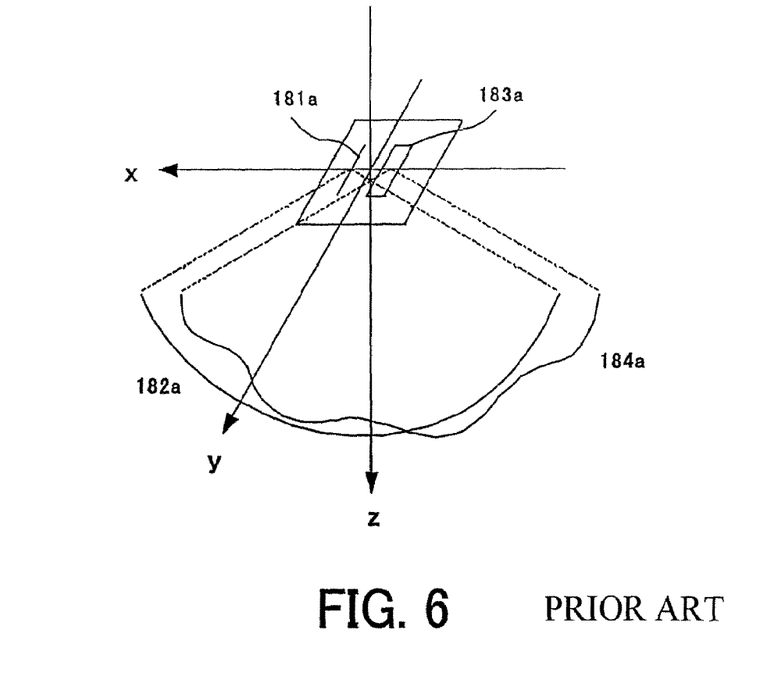
FIG. 6 is a schematic view of the lights exited from a slit and a window in the second mask shown in FIG. 5.

The light diffracted at the slit 181a has an equiphase wavefront in the x direction. The wavefront that transmits the window 183a has wavefront aberration information of the projection optical system 160 in the x direction, since it has shaped by the window 144a into a wave front having an equiphase in the x direction, and has transmitted through the projection optical system 160. FIG. 6 shows the light exited from the slit 181a and the center of the window 183a. Understandably, the light that passes the slit 181a has an ideal cylindrical wavefront front or ideal elliptical wavefront 182a, and the light that passes the window 183a has a target wavefront.

Therefore, the wavefront aberration of the projection optical system 160 in the x direction can be obtained by calculating the phase information from the interference fringe observed by (each pixel in) the image taking means 186. In calculating the phase information from the interference fringe, the fringe scan method may be used by driving the diffraction grating 148a using driving means (not shown) or the electronic Moiré method may be used.

Figure 7:
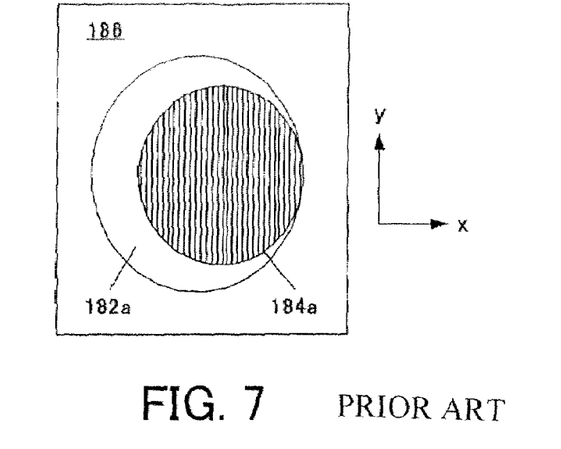
FIG. 7 is a schematic plane view showing one exemplary interference fringe of the lights exited from the slit and window shown in FIG. 5, to be detected by an image taking means shown in FIGS. 1 and 2.

FIG. 7 shows an illustrative interference fringe of the light exited from the slit 181a and the center of the window 183a, to be detected by the image taking means 186. An interference fringe occurs in a common area of two pupil images of the projection optical system 160, which have centers offset by an interval between the slit 181a and the window 183a. Since the light 182a has an equiphase wavefront in the x direction, the wavefront aberration of the projection optical system 160 in the x direction can be obtained by picking up the phase information from the interference fringe shown in FIG. 7. The phase information is obtained by using a so-called fringe scan method. In the fringe scan method, the mask stage 150 scans the diffraction grating 148a by about one pitch in a direction perpendicular to the line of the diffraction grating or the x direction, and the image taking means 186 photographs plural interference fringes.

The plural captured interference fringes sent from the image taking means 186 to the controller 190 via the cable 188, and the controller 190 obtains the phase information. The controller 190 can use, for example, an electronic Moiré method in obtaining the phase information. The interference fringe has a carrier fringe as shown in FIG. 7 in this embodiment, and the carrier fringe that is prepared by the controller 190 or previously produced and stored in the memory 192 should be multiplied by the captured interference fringe. Use of the electronic Moiré method is advantageous from a viewpoint of the time because the phase information can be taken from one interference fringe.

Next, the wavefront aberration of the projection optical system 160 in the y direction is measured (step 1004). Similar to the step 1002, the driving mechanism (not shown) moves the illumination optical system 120 and the mask stage 150 relative to each other so that the light from the condenser lens 126 irradiates only the 90° orienting slit 143b and window 144b.

Since the slit 143b has a width that meets Equation 1, the light exited from the slit 143b becomes the diffraction light having an equiphase wavefront in the y direction. On the other hand, the light diffraction in the x direction or the longitudinal direction of the slit 144b is so small that the condenser lens 126 condenses into the slit 144b the light that has a NA equal to or greater than the NA of the projection optical system 160 at the object side or the reticle side with respect to the x direction in FIG. 3. Thereby, the light can be irradiated onto the entire pupil surface in the projection optical system 160. The light has an equiphase wavefront in the y direction in FIG. 4. On the other hand, the light that passed the window 144b is the light with an aberration of the second illumination optical system 120. The slit 143b and window 144b in the first mask 142 are imaged on the second mask 180 placed on the wafer stage 170 via the projection optical system 160. The position of the second mask 180 is adjusted by driving the wafer stage 170 so that the slit 143b in the first mask 142 images on the window 183b in the second mask 180 and the window 144b images on the slit 181b.

The light that passes the window 183b receives the influence of the wavefront aberration of the projection optical system 160. On the other hand, the slit 181b has a width that meets Equation 2 and thus the light exited from the slit 181b spread in the y direction, as the diffracted light having an equiphase wavefront from which the wavefront aberration information of the projection optical system 160 is removed in the y direction. The fringe scan method is also used to obtain the phase of the interference fringe, similar to the step 1002. In the fringe scan method, the mask stage 150 scans the diffraction grating 148b by one pitch in a direction perpendicular to the line of the diffraction grating or the b direction, and the image taking means 186 photographs plural interference fringes.

The plural captured interference fringes sent from the image taking means 186 to the controller 190 via the cable 188, and the controller 190 obtains the phase information. The controller 190 can use, for example, an electronic Moiré method in obtaining the phase information. Since the wavefront from the slit 181b has an equiphase wavefront in the y direction, the phase measured in the step 1004 contains the wavefront aberration information in the y direction of the projection optical system 160.

While this embodiment uses the alignment optical system 120 to illuminate the mask, i.e., the first mask 142 and the second mask 180, in the measuring device (101a, 101b), the present invention does not limit the illumination of the mask to the alignment optical system 120 but may use the illumination optical system 112. Each of the wavefront aberrations in the x and y directions obtained in steps 1002 and 1004 is the wavefront aberration of the projection optical system 160 which provides the relative relationship only in the x or y direction. Therefore, step 1006 that synthesizes two wavefront aberrations is required to calculate the wavefront aberration of the projection optical system that provides a correct two-dimensional relative relationship.

The controller 190 obtains the wavefront aberration of the projection optical system 160 that provides the correct two-dimensional relative relationship by synthesizing the wavefront aberrations in the x and y directions of the projection optical system 160 obtained in steps 1002 and 1004 (step 1006). Step 1006 is executed in accordance with a flowchart shown in FIG. 9.

Figure 9:
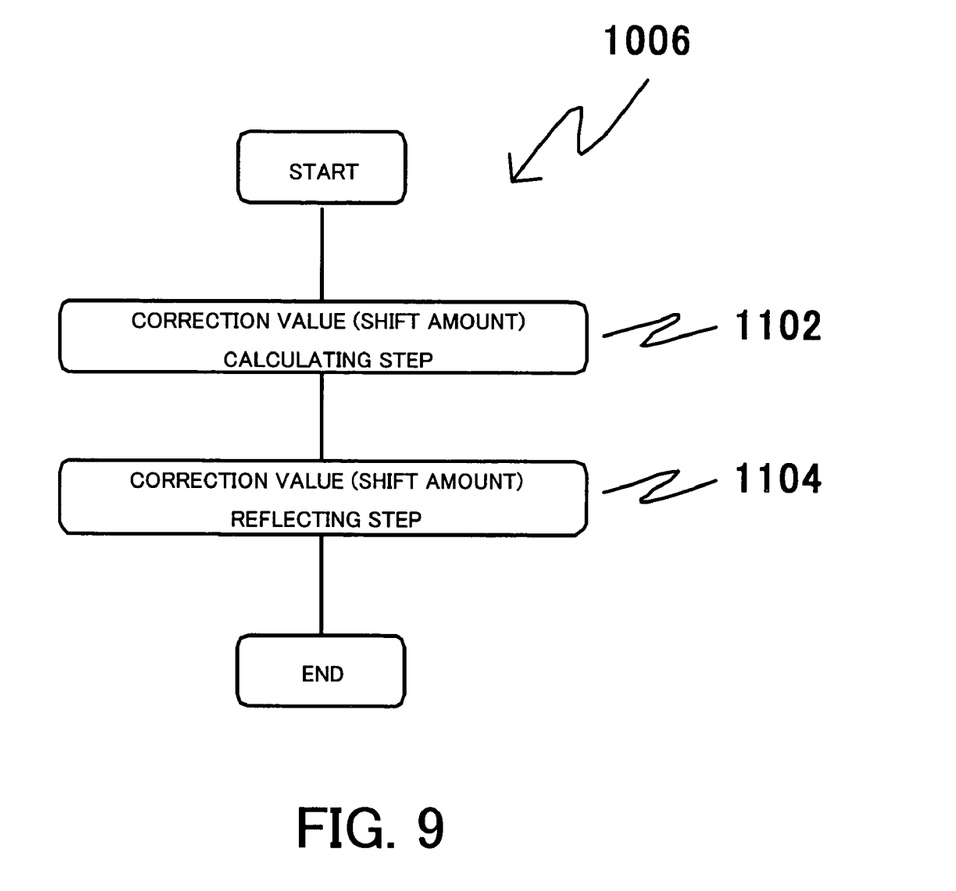
FIG. 9 is a flowchart for explaining a synthesizing step of the wavefront aberrations shown in FIG. 8.

Referring now to FIG. 9, a detailed description will be given of a synthesizing method that utilizes the statistical approach. A correction-value calculating step 1102 in FIG. 9 determines a correction value to be added to each column of the x-direction wavefront aberration or each row of the y-direction wavefront aberration. The following description refers to the correction value as a shift amount, because the correction value provides the measurement values in one direction in which a relative relationship (or difference) is correct, with an effect of shift by a correction value. A description will be given of an implementing method of step 1102 using a statistical analysis and equations.

For example, assume that the x-direction wavefront aberration has measurement values represented by a n×n matrix, and a measurement value in the (1, j)-th element is defined as $W_{ij}^X$. Assume that when a shift amount $c_1^X$ is added to all the measurement values in the first row, the measurement values in the first row provide as $W_{1j}^X + c_1^X$ a correct relative relationship. The measurement value of (i, j)-th element is expressed as $W_{ij}^X + c_i^X$.

Also, assume that for the y-direction wavefront aberration, (i, 1)-th pixel is defined as $W_{i1}^Y$. Assume that when a constant $c_1^Y$ is added to all the measurement values in the first column, the proper measurement values in the first column are obtained as $W_{i1}^Y + c_1^Y$. The measurement value of (i, j)-th pixel is expressed as $W_{ij}^Y + c_j^Y$. Thus, the (i, j)-th element of the synthesized wavefront aberrations is expressed either $W_{ij}^X + c_i^X$ or $W_{ij}^Y + c_j^Y$, and both measurement values are equal to each other. Therefore, the following Equation is met:

$$W_{ij}^X + c_i^X - (W_{ij}^Y + c_j^Y) = 0 \quad \text{[EQUATION 4]}$$

Equation 4 is met as a maximum number of n×n simultaneous equations for all the pixels (in the image taking means 186) having the wavefront aberration information. On the other hand, the number of unknowns is 2n, $c_1^X, c_2^X, \ldots c_n^X, c_1^Y, c_2^Y, \ldots c_n^Y$. Therefore, a statistical approach, such as the least-squares method, is applicable to an optimal solution of the shift amount.

The next shift-amount reflecting step 1104 adds the shift amounts calculated in step 1202 to the x-direction and y-direction wavefront aberrations so as to obtain the two-dimensional wavefront aberration. More specifically, a x synthesized wavefront may be additions of shift amounts $c_1^X, c_2^X, \ldots c_n^X$ to corresponding rows of x-direction wavefront aberration. A y synthesized wavefront may be additions of shift amounts $c_1^Y, c_2^Y, \ldots c_n^Y$ to corresponding rows of y-direction wavefront aberration. Alternatively, a synthesized wavefront may be defined as an average of the corrected measurement values of the x and y synthesized wavefronts for each element.

Figure 10:
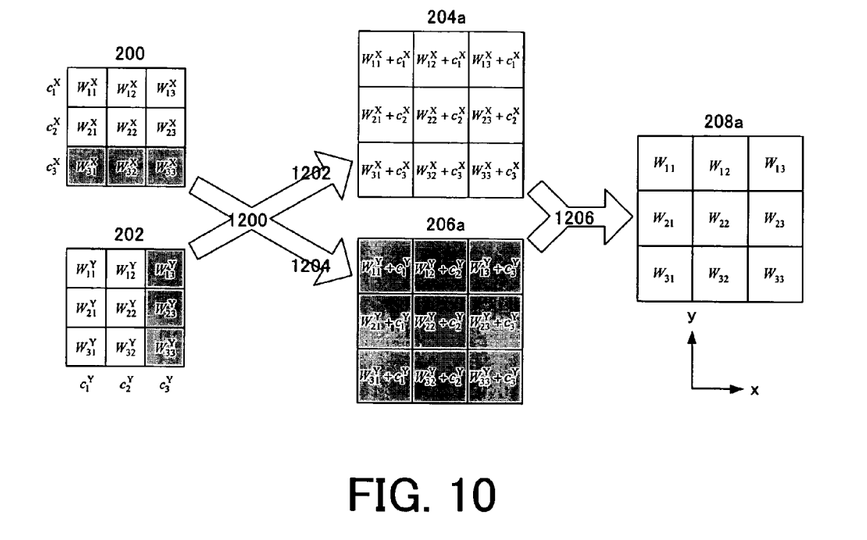
FIG. 10 is a schematic view for explaining a calculation example that relies upon a statistical analysis in the synthesizing process shown in FIG. 9.

Referring now to FIG. 10, a description will be given of a calculation example to obtain the two-dimensional wavefront aberration from an actual 3×3 matrix of the x and y synthesized wavefronts using the synthesizing means that utilizes the least-squares method.

FIG. 10 sets a measurement value of the (i, j)-element in the x-direction wavefront aberration 200 to $W_{ij}^X$, and a measurement value of the (i, j)-element in the y-direction wavefront aberration 202 to $W_{ij}^Y$ (i=1~3, j=1~3). In this case, the x-direction wavefront aberration 200 has correct relative relationships in the x direction among $W_{11}^X, W_{12}^X, W_{13}^X$ and $W^{2 \mu X}$, $W_{22}^X, W_{23}^X$ and $W_{31}^X, W_{32}^X, W_{33}^X$. The y-direction wavefront aberration 202 has correct relative relationships in the y direction among $W_{11}^Y, W_{21}^Y, W_{31 Y}$ and $W^{12Y}, W_{22}^Y$, $W_{32}^Y$ and $W_{13}^Y, W_{23}^Y, W_{33}^Y$. In FIG. 10, reference numerals 1200, 1202, 1204 and 1206 denote calculating steps, and reference numerals 204a, 206a and 208a are two-dimensional aberrations as calculation results. The above steps will now be described in detail:

The calculating step 1200 calculates a shift amount to be added to each row in the x-direction wavefront aberration 200 or each column in the y-direction wavefront aberration 202. Assume that additions of the shift amounts $c_1^X, c_2^X, c_3^X$ to corresponding rows in the x-direction wavefront aberration 200 provide a correct relative relationship in the y direction and the correct two-dimensional wavefront aberration. Similarly, assume that additions of the shift amounts $c_1^Y, c_2^Y, c_3^Y$ to corresponding columns in the y-direction wavefront aberration 202 provide the two-dimensional wavefront aberration. Since the two-dimensional wavefront aberration obtained from the x-direction wavefront aberration 200 is equal to the two-dimensional wavefront aberration obtained from the y-direction wavefront aberration 202, the following Equation is met for each element.

$$\begin{aligned} W_{11}^X + c_1^X - (W_{11}^Y + c_1^Y) = 0, \quad W_{12}^X + c_1^X - (W_{12}^Y + c_2^Y) = 0, \quad W_{13}^X + c_1^X - (W_{13}^Y + c_3^Y) = 0, \\ W_{21}^X + c_2^X - (W_{21}^Y + c_1^Y) = 0, \quad W_{22}^X + c_2^X - (W_{22}^Y + c_2^Y) = 0, \quad W_{23}^X + c_2^X - (W_{23}^Y + c_3^Y) = 0, \\ W_{31}^X + c_3^X - (W_{31}^Y + c_1^Y) = 0, \quad W_{32}^X + c_3^X - (W_{32}^Y + c_2^Y) = 0, \quad W_{33}^X + c_3^X - (W_{33}^Y + c_3^Y) = 0, \end{aligned} \quad \text{[EQUATION 5]}$$

In addition, since (the absolute value cannot be obtained and) the measurement result provides the correct wavefront aberration only between pixels' measurement values, any one of $c_1^X, c_2^X, c_3^X, c_1^Y, c_2^Y, c_3^Y$ may be set to zero.

$$c_1^X = 0 \quad \text{[EQUATION 6]}$$

From Equations 5 and 6, ten simultaneous equations are met for six unknowns. Next, $c_1^X, c_2^X, c_3^X, c_1^Y, c_2^Y, c_3^Y$ are determined by using the least-squares method. Assume a sum of squares in the left sides in Equations 5 and 9 is m.

$$m = \sum_{i=1}^{3} \sum_{j=1}^{3} (W_{ij}^X + c_i^X - (W_{ij}^Y + c_j^Y))^2 \quad \text{[EQUATION 7]}$$

It is necessary to calculate $c_1^X, c_2^X, c_3^X, c_1^Y, c_2^Y, c_3^Y$ that minimizes m. To minimize the m value, a value that partial differentiation of Equation 7 by each of $c_1^X, c_2^X, c_3^X, c_1^Y, c_2^Y, c_3^Y$ should be zero. This condition and Equation 6 establish the following simultaneous equations:

[EQUATION 8]

$$\frac{\partial m}{\partial c_2^X} = 2 \times (3c_2^X - c_1^Y - c_2^Y - c_3^Y + W_{21}^X + W_{22}^X + W_{23}^X - W_{21}^Y - W_{22}^Y - W_{23}^Y) = 0$$

$$\frac{\partial m}{\partial c_3^X} = 2 \times (3c_3^X - c_1^Y - c_2^Y - c_3^Y + W_{31}^X + W_{32}^X + W_{33}^X - W_{31}^Y - W_{32}^Y - W_{33}^Y) = 0$$

$$\frac{\partial m}{\partial c_1^Y} = -2 \times (-c_2^X - c_3^X + 3c_1^Y + W_{11}^X + W_{21}^X + W_{31}^X - W_{11}^Y - W_{21}^Y - W_{31}^Y) = 0$$

$$\frac{\partial m}{\partial c_2^Y} = -2 \times (-c_2^X - c_3^X + 3c_2^Y + W_{12}^X + W_{22}^X + W_{32}^X - W_{12}^Y - W_{22}^Y - W_{32}^Y) = 0$$

$$\frac{\partial m}{\partial c_3^Y} = -2 \times (-c_2^X - c_3^X + 3c_3^Y + W_{13}^X + W_{23}^X + W_{33}^X - W_{13}^Y - W_{23}^Y - W_{33}^Y) = 0$$

The above five equations can be rewritten into the following determinant:

[EQUATION 9]

$$\begin{pmatrix} 3 & 0 & -1 & -1 & -1 \\ 0 & 3 & -1 & -1 & -1 \\ -1 & -1 & 3 & 0 & 0 \\ -1 & -1 & 0 & 3 & 0 \\ -1 & -1 & 0 & 0 & 3 \end{pmatrix} \begin{pmatrix} c_2^X \\ c_3^X \\ c_1^Y \\ c_2^Y \\ c_3^Y \end{pmatrix} = \begin{pmatrix} -W_{21}^X & -W_{22}^X & -W_{23}^X & +W_{21}^Y & +W_{22}^Y & +W_{23}^Y \\ -W_{31}^X & -W_{32}^X & -W_{33}^X & +W_{31}^Y & +W_{32}^Y & +W_{33}^Y \\ -W_{11}^X & -W_{21}^X & -W_{31}^X & +W_{11}^Y & +W_{21}^Y & +W_{31}^Y \\ -W_{12}^X & -W_{22}^X & -W_{32}^X & +W_{12}^Y & +W_{22}^Y & +W_{32}^Y \\ -W_{13}^X & -W_{23}^X & -W_{33}^X & +W_{13}^Y & +W_{23}^Y & +W_{33}^Y \end{pmatrix}$$

$c_2^X, c_3^X, c_1^Y, c_2^Y, c_3^Y$ can be calculated by an operation, for example, utilizing the LU decomposition. Thus, shift amounts $c_1^X, c_2^X, c_3^X, c_1^Y, c_2^Y, c_3^Y$ are determined.

Steps 1202 and 1204 reflect the shift amounts $c_1^X, c_2^X, c_3^X$, $c_1^Y, c_2^Y, c_3^Y$ calculated in step 1202 on the wavefronts 200 and 202. Step 1202 adds $c_1^X, c_2^X, c_3^X$ to the measurement values in corresponding rows in wavefront aberration 200, and obtains the two-dimensional wavefront 204a. Step 1204 adds $c_1^Y, c_2^Y, c_3^Y$ to the measurement values in corresponding columns in wavefront aberration 202, and obtains the two-dimensional wavefront 206a.

Step 1206 calculates averages $W_{ij}$ of the measurement values of the wavefronts 204a and 206a for each element, and obtains the wavefront 208a. The two-dimensional wavefront aberration as a final measurement result may use any one of the wavefronts 204a, 206a and 208a.

While a concrete calculation illustration of the 3×3 matrix wavefront has been described, Equation 9 can be expanded to Equation that meets for the wavefront of the n×n matrix due to its regularity.

The synthesizing method of the first embodiment uses a statistical analysis and information of all the rows in the x-direction wavefront aberration and all the columns in the y-direction wavefront aberration to determine the shift amounts, and cancels random error factors, such as electric noises, providing a two-dimensional wavefront with excellent reproducibility.

Second Embodiment

The second embodiment is different from the first embodiment in the processing method in step 1006 shown in FIG. 8, and a description will address only that difference.

Similar to the first embodiment, a detailed description will be given of the synthesizing method of this embodiment with reference to FIG. 9. The shift amount calculating step 1102 in FIG. 9 sets a shift amount for each row in the x-direction wavefront aberration to a difference between measurement values of any one of columns in the y-direction wavefront aberration and measurement values of the x-direction wavefront aberration at the same pixel positions. Alternatively, the shift amount calculating step 1102 sets a shift amount for each column in the y-direction wavefront aberration to a difference between measurement value of any one of rows in the x-direction wavefront aberration and measurement values of the y-direction wavefront aberration at the same pixel positions. The next shift-amount reflecting step 1104 reflects the shift amounts determined in step 1202 on the x-direction or y-direction wavefront aberration, and obtains a synthesized wavefront.

A description will be given of one specific example that calculates a synthesized wavefront by shifting each row in the x-direction wavefront aberration based on the center column of the y-direction wavefront aberration. Initially, a difference value between each column of the first row in the x-direction wavefront aberration and the first center column in the y-direction wavefront aberration is added to a value of each first center column in the y-direction wavefront aberration, so as to form a value of each column of the first row in the synthesized wavefront. In other words, a difference value between each column of the first row in the x-direction wavefront aberration and the first center column in the y-direction wavefront aberration is set to a correction value to be added to each column of the first row in the x-direction wavefront aberration. Next, a difference value between each column of the second row in the x-direction wavefront aberration and the second center column in the y-direction wavefront aberration is added to a value of second center column in the y-direction wavefront aberration, so as to form a value of each column of the second row in the synthesized wavefront. In other words, a difference value between each column of the second row in the x-direction wavefront aberration and the second center column in the y-direction wavefront aberration is set to a correction value to be added to each column of the second row in the x-direction wavefront aberration. This procedure makes the relative relationship of the measurement values of the first and second rows equal to each other. By repeating this procedure for all the elements, the wavefront aberration of the projection optical system has a corrected two-dimensional relative relationship.

This embodiment discusses a specific example that provides a two-dimensional wavefront aberration by shifting each row in the x-direction wavefront aberration on the basis of the center column in the y-direction wavefront aberration. However, the two-dimensional wavefront aberration can be similarly obtained by shifting each column in the y-direction wavefront aberration on the basis of the center row in the x-direction wavefront aberration. Alternatively, the reference column or row is not limited to the center column or row, and a column or row in which the measurement values have a correct relative relationship may be used for the basis.

Moreover, the step 1104 may use one that shifts the x-direction wavefront aberration for the synthesized wavefront (or x synthesized wavefront), or one that shifts the y-direction wavefront aberration for the synthesized wavefront (or y synthesized wavefront). Alternatively, averages of corrected measurement values in the x and y synthesized wavefronts for respective elements may be used for the final synthesized wavefront.

Figure 11:
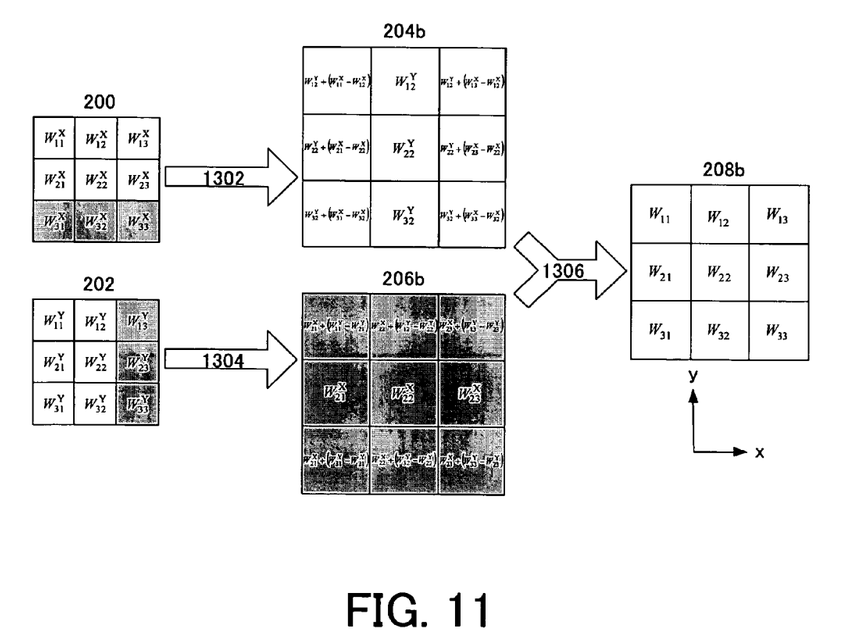
FIG. 11 is a schematic view for explaining a calculation example that does not rely upon a statistical analysis in the synthesizing process shown in FIG. 9.

Referring now to FIG. 11, a description will be given of a concrete processing method to obtain a two-dimensional wavefront from the 3×3 matrix of the x-direction and y-direction wavefronts.

Similar to FIG. 10, FIG. 11 sets a measurement value of the (i,j)-pixel in the x-direction wavefront aberration 200 to $W_{ij}^X$, and a measurement value of the (i, j)-pixel in the y-direction wavefront aberration 202 to $W_{ij}^Y$ (i=1~3, j=1~3). The x-direction wavefront aberration 200 has correct relative relationships in the x direction among $W_{11}^X, W_{12}^X, W_{13}^X$ and $W^{21X}$, $W_{22}^X, W_{23}^X$ and $W_{31}^X, W_{32}^X, W_{33}^X$. The y-direction wavefront aberration 202 has correct relative relationships in the y direction among $W_{11}^Y, W_{21}^Y, W_{31}^Y$ and $W^{12Y}, W_{22}^Y, W_{32}^Y$ and $W_{13}^Y, W_{23}^Y, W_{33}^Y$. In FIG. 11, reference numerals 1302, 1304, and 1306 denote calculating steps, and reference numerals 204b, 206b and 208b are two-dimensional aberrations obtained as calculation results.

Step 1302 shifts each column in the wavefront 202 on the basis of the second column $W_{12}^Y, W_{22}^Y, W_{32}^Y$ in the wavefront 200, and obtains the synthesized wavefront 204b. More specifically, a value $W_{12}^Y+(W_{11}^X-W_{12}^X)$, which is a value $W^{12Y}$ of the reference second column of the first row in the wavefront 202 added to a difference value $W_{11}^X-W_{12}^X$ between a value $W_{11}^X$ of (1, 1)-th element in the wavefront 200 and a value $W_{12}^X$ of the reference second column of the first row, is set to a value of (1, 1)-th element in the synthesized wavefront 204b. This procedure is repeated similarly. In other words, each of $W_{12}^Y-W_{12}^X$, $W_{22}^Y-W_{22}^X$, and $W^{32X}-W_{32}^X$ is used as a correction value to be added to a value of each row in the wavefront 200. This process provides the synthesized wavefront 204b with the two-dimensional wavefront aberration having the correct relative relationship both in the x and y directions.

Step 1304 shifts each column in the wavefront 202 on the basis of the second column $W_{21}^X, W_{22}^X, W_{23}^X$ in the wavefront 200, and obtains the synthesized wavefront 206b. More specifically, similar to step 1302, a measurement value in the synthesized wavefront is set to a value of the reference row of each column in the wavefront 200 added to a difference value between each row of each column in the wavefront 202 and the reference row of each column in the wavefront 200. In other words, each of $W_{21}^X-W_{21}^Y$, $W_{22}^X-W_{22}^Y$, and $W^{23X}-W_{23}^Y$ is used as a correction value to be added to a value of each column in the wavefront 202. This process provides the synthesized wavefront 206b with the two-dimensional wavefront aberration having the correct relative relationship both in the x and y directions.

Step 1306 calculates averages $W_{ij}$ of the measurement values in the wavefronts 204b and 206b for each element, and obtains the wavefront 208b. The two-dimensional wavefront aberration as the final measurement result may use any one of the wavefronts 204b, 206b and 208b. While the first embodiment utilizes wavefront aberration of all the rows in the x-direction wavefront aberration and all the columns in the y-direction wavefront aberration, this embodiment utilizes information of only one row or column for one wavefront and is subject to random error factors, such as noises. On the other hand, the calculation speed in synthesizing the x-direction and y-direction wavefront aberrations with each other is faster than that of the first embodiment. Therefore, one of the first and second embodiments is selected in accordance with an environment in which the measuring device is placed and by taking the above characteristics of each algorism into account.

Further, the present invention is not limited to these two embodiments, and various variations and modifications may be made without departing from the scope of the present invention. For example, while the above embodiments discuss with the LDI, a shearing interferometer (or Tarbo interferometer), such as an LSI, may be applied. In addition, the present invention is not limited to a wavefront aberration obtained by the measurement using the LDI and LSI. For example, the present invention is applicable in obtaining an image having a correct two-dimensional relative relationship from one image that has a correct relative relationship in one direction, and another image that has a correct relative relationship in another direction.

In this embodiment, the first and second directions are two orthogonal directions or x and y directions. However, these two directions are not limited to a linear or orthogonal relationship, and the present invention is applicable to an occasion where respective directions are curves and do not have an orthogonal relationship.

Third Embodiment

A description will now be given of an aberration correcting method common to the first and second embodiments. The exposure apparatus 100 allows plural optical elements (not shown) in the projection optical system 160 to move in the optical-axis direction and/or a direction orthogonal to the optical-axis direction. By driving one or more optical elements using a driving system (not shown) for aberrational adjustments based on aberrational information obtained from the instant embodiment, it is possible to correct or optimize one or more aberrations of the projection optical system 160, in particular Zeidel's classification of aberrations. The means for adjusting the aberration of the projection optical system 160 can use various known systems, such as a movable lens, a movable mirror (when the projection optical system is a catadioptric optical system or full-mirror optical system), an inclinable parallel plate, a pressure-controllable space, and a surface correction using an actuator.

Fourth Embodiment

A description will now be given of the inventive exposure method. In the normal exposure, the light emitted from the light source section 105 is deflected by a deflection optical system 110 to the first illumination optical system 112 in the exposure apparatus 100. The second illumination optical system 120, if any, is arranged outside the optical path during the normal exposure. The light incident upon the first illumination optical system 112 experiences the beam shaping, incoherent processing, σ adjusting, field adjusting, etc. and, for example, Koehler-illuminates the mask 152. The mask 152 is placed on the mask stage 150, and driven during exposure in the scanner. The light that passes the mask 152 and reflects the mask pattern is imaged onto the plate 172 fixed onto the stage via the wafer chuck (not shown) by the projection optical system 160 at a projection magnification (such as ¼ and ⅕). The wafer is provided on the wafer stage 170, and driven during the exposure. Since the aberration of the projection optical system 160 is corrected, the plate 172 can receive the high-quality exposure process (or the desired resolution).

Fifth Embodiment

Figure 12:
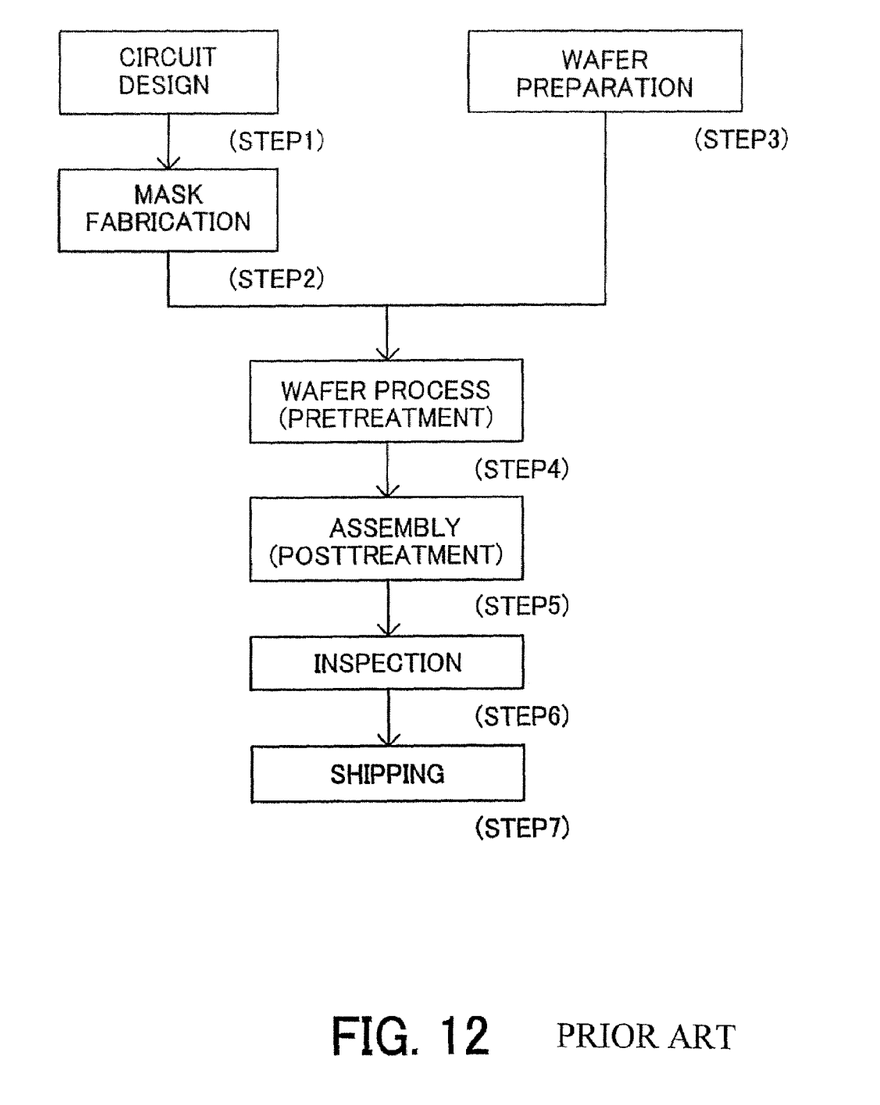
FIG. 12 is a flowchart for explaining a method for fabricating devices (semiconductor chips such as ICs, LSIs, and the like, LCDs, CCDs, etc.).
Figure 13:
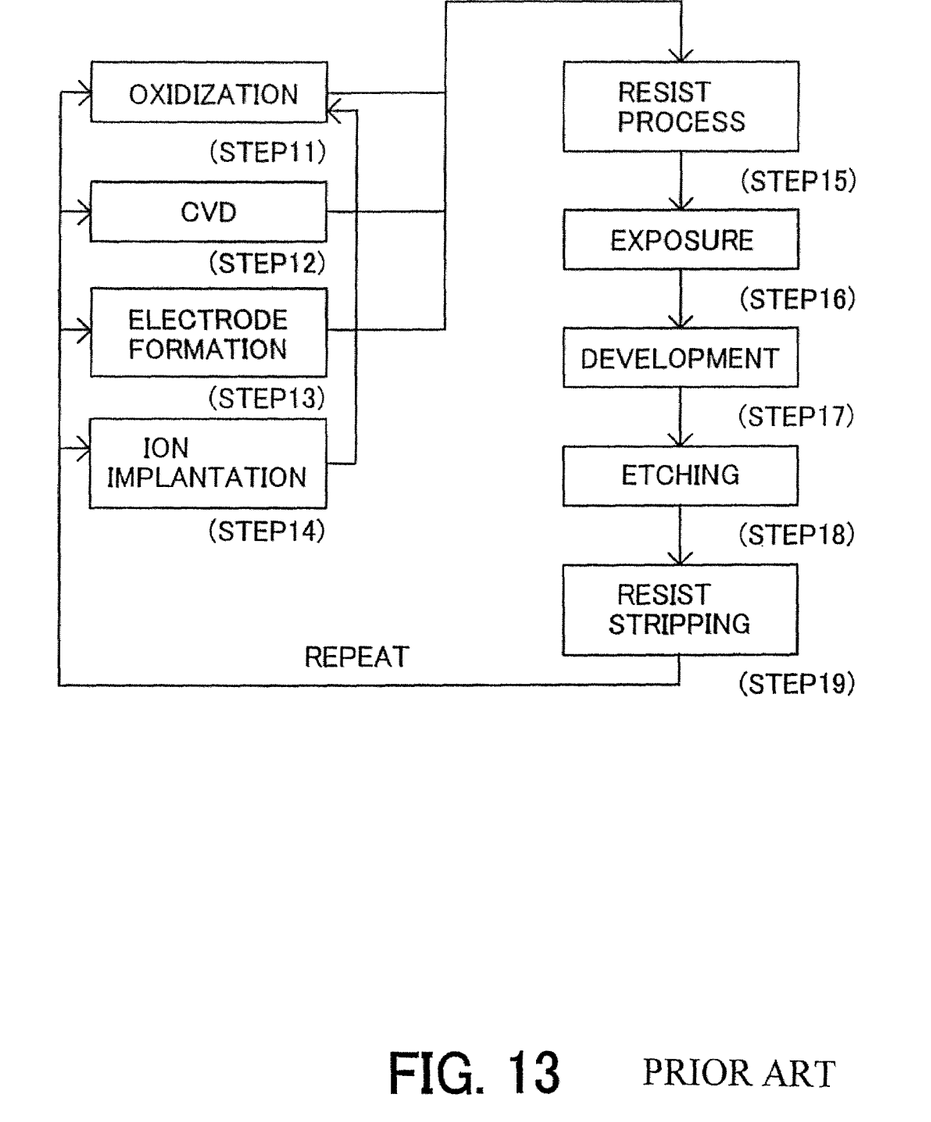
FIG. 13 is a detailed flowchart for Step 4 of wafer process shown in FIG. 12.

Referring now to FIGS. 12 and 13, a description will now be given of an embodiment of a device manufacturing method using the exposure apparatus 100, etc. FIG. 12 is a flowchart for explaining a fabrication of devices (i.e., semiconductor chips such as IC and LSI, liquid crystal panels, CCDs, etc.). Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4 shown in FIG. 12. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a mask pattern onto the wafer. Step 17 (development) develops the exposed wafer 47. Step 18 (etching) etches parts other than a developed resist image. Step 19 (resist stripping) removes disused resist after etching. These steps are repeated, and multilayer circuit patterns are formed on the wafer. The manufacturing method of this embodiment can quickly and easily obtain the imaging performance of the projection optical system 160 without lowering the exposure throughput, and utilize the projection optical system 160 whose wavefront aberration has been highly precisely corrected. Therefore, the manufacture semiconductor devices with good productivity and economical efficiency (such as semiconductor devices, LCD devices, image pickup devices (e.g., CCDs), and thin film magnetic heads) which have been difficult to manufacture. The projection optical system 160 whose wavefront aberration has been highly precisely corrected can provide an alignment of the wafer stage with high precision. The device manufacturing method that uses the exposure apparatus 100, and its resultant (intermediate and final) products also constitute one aspect of the present invention.

This application claims a foreign priority based on Japanese Patent Application No. 2004-269731, filed Sep. 16, 2004, which is hereby incorporated by reference herein.

What is claimed is:

1. An adjusting method for adjusting a target optical system, said adjusting method comprising the steps of:

measuring a wavefront aberration in a first direction of the target optical system and a wavefront aberration in a second direction different from the first direction of the target optical system;

calculating a first correction value and a second correction value based on a matrix equation assuming that a matrix that is made by adding a first correction value to each column of the first matrix is equal to a matrix that is made by adding a second correction value to each row of the second matrix, the first correction value being able to be different every column, the second correction value being able to be different every row, the first matrix representing the wavefront aberration in the first direction measured by said measuring step, and the second matrix representing the wavefront aberration in the second direction measured by said measuring step;

obtaining a two-dimensional wavefront aberration of the target optical system by calculating the matrix that is made by adding the first correction value that has been calculated to the first matrix and/or the matrix that is made by adding the second correction value that has been calculated to the second matrix; and adjusting the target optical system based on the obtained two-dimensional wavefront aberration.

2. An adjusting method according to claim 1, wherein the calculating step calculates the first correction value and the second correction value so as to minimize a square sum of each matrix element of a difference between the matrix that is made by adding the first correction value to each column of the first matrix and the matrix that is made by adding the second correction value to each row of the second matrix.

3. An adjusting method according to claim 1, wherein the obtaining step obtains the two-dimensional wavefront aberration by calculating an average between the matrix that is made by adding the first correction value that has been calculated to the first matrix, and the matrix that is made by adding the second correction value that has been calculated to the second matrix.

4. An adjusting method for adjusting a target optical system, said adjusting method comprising the steps of:

measuring a wavefront aberration in a first direction of the target optical system and a wavefront aberration in a second direction different from the first direction of the target optical system;

calculating, where a reference value is defined as one column in a first matrix or one row in a second matrix, a correction value that is a difference between the reference value and a column in the second matrix if the reference value is the one column, or a correction value that is a difference between the reference value and a row in the first matrix if the reference value is the one row, each of the column and the row corresponding to each of the one column and the one row, the first matrix representing the wavefront aberration in the first direction measured by said measuring step, and the second matrix representing the wavefront aberration in the second direction measured by said measuring step;

obtaining a two-dimensional wavefront aberration by adding the calculated correction value to each column in the second matrix if the reference value is the one column, or by adding the calculated correction value to each row in the first matrix if the reference value is the one row; and adjusting the target optical system based on the obtained two-dimensional wavefront aberration.

5. An adjusting method according to claim 4, wherein the correction value calculating step calculates a first correction value by defining one row in the second matrix as a reference row value, and a second correction value by defining one column in the first matrix as a reference column value, the first correction value being a difference between the reference row value and a value of a row in the first matrix corresponding to the one row in the second matrix, and the second correction value being a difference between the reference column value and a value of a column in the second matrix corresponding to the one column in the first matrix, and wherein the obtaining step obtains the two-dimensional wavefront aberration by calculating an average value between a matrix that is made by adding a first correction value to each row in the first matrix, and a matrix that is made by adding a second correction value to each column in the second matrix.

6. A measuring device configured to measure a two-dimensional wavefront aberration of a target optical system, said measuring device comprising:

a measuring part configured to measure a wavefront aberration in a first direction of the target optical system and a wavefront aberration in a second direction different from the first direction of the target optical system; and an operating means configured to calculate a first correction value and a second correction value based on a matrix equation assuming that a matrix that is made by adding a first correction value to each column in the first matrix is equal to a matrix that is made by adding a second correction value to each row in the second matrix, the first correction value being able to be different every column, the second correction value being able to be different every row, the first matrix representing the wavefront aberration in the first direction measured by the measuring part, and the second matrix representing the wavefront aberration in the second direction measured by the measuring part, to find at least one of a matrix that is made by adding the first correction value that has been calculated to the first matrix, and the matrix that is made by adding the second correction value that has been calculated to the second matrix, and to find the two-dimensional wavefront aberration.

7. A measuring device according to claim 6, wherein the operating means calculates the first correction value and the second correction value so as to minimize a square sum of each matrix element of a difference between the matrix that is made by adding the first correction value to each column in the first matrix and the matrix that is made by adding the second correction value to each row in the second matrix.

8. A measuring device according to claim 6, wherein the operating means obtains the two-dimensional wavefront aberration by calculating an average between the first correction value that has been calculated to the first matrix, and the matrix that is made by adding the second correction value that has been calculated to the second matrix.

9. A measuring device configured to measure a two-dimensional wavefront aberration of a target optical system, said measuring device comprising:

a measuring part configured to measure a wavefront aberration in a first direction and a wavefront aberration in a second direction different from the first direction of the target optical system;

an operating means configured to calculate a correction value by defining a reference value as one column in a first matrix or one row in a second matrix, a correction value being a difference between the reference value and a column in the second matrix if the reference value is the one column, or a correction value being a difference between the reference value and a row in the first matrix if the reference value is the one row, each of the column and the row corresponding to each of the one column and the one row, the first matrix representing the wavefront aberration in the first direction measured by the measuring part, and the second matrix representing the wavefront aberration in the second direction measured by the measuring part, to add the calculated correction value to each column in the second matrix if the reference value is the one column or to add the calculated correction value to each row in the first matrix if the reference value is the one row, and to find the two-dimensional wavefront aberration.

10. A measuring device according to claim 9, wherein the operating means calculates a first correction value by defining one row in the second matrix as a reference row value, and a second correction value by defining one column in the first matrix as a reference column value, the first correction value being a difference between the reference row value and a value of a row in the first matrix corresponding to the one row in the second matrix, and the second correction value being a difference between the reference column value and a value of a column in the second matrix corresponding to the one column in the first matrix, and wherein the obtaining step obtains the two-dimensional wavefront aberration by calculating an average value between a matrix that is made by adding a first correction value to each row in the first matrix, and a matrix that is made by adding a second correction value to each column in the second matrix.

11. A measuring device according to claim 6, wherein the measuring part includes:

a first mask that has a slit and a window illuminated by light from a light source;

a second mask that has a window that transmits a ray that has passed the slit and the target optical system, and a slit that transmits a ray that has passed the window of the first mask and the target optical system; and an image sensor that detects an interference pattern of the ray that has transmitted the slit of the second mask and the ray that has transmitted the window of the second mask, wherein the wavefront aberration in the first direction of the target optical system is measured by setting the first direction to a short length direction of the slits and the windows of the first and second masks, and the wavefront aberration in the second direction of the target optical system is measured by setting the second direction to a short length direction of the slits and the windows of the first and second masks.

12. An exposure apparatus for exposing an image of a pattern of a mask onto a substrate by using light from a light source, said exposure apparatus comprising:

a projection optical system configured to project the image of the pattern onto the substrate; and a measuring device according to claim 6 configured to measure a two-dimensional wavefront aberration of the projection optical system as a target optical system.

* * * * *